United States Patent [19]

Benton et al.

[11] 4,266,986

[45] May 12, 1981

[54] PASSIVATION OF DEFECTS IN LASER ANNEALED SEMICONDUCTORS

[75] Inventors: Janet L. Benton, Warren; Charles J. Doherty; Lionel C. Kimerling, both of Westfield; Harry J. Leamy, Summit, all of N.J.

[73] Assignee: Bell Telephone Laboratories, Incorporated, Murray Hill, N.J.

[21] Appl. No.: 98,398

[22] Filed: Nov. 29, 1979

[51] Int. Cl.$^3$ .................................. H01L 21/265
[52] U.S. Cl. ............................... 148/1.5; 148/187; 357/91; 427/35; 427/53.1
[58] Field of Search ............... 148/1.5, 187; 357/91; 427/53.1, 37, 38, 35

[56] References Cited

U.S. PATENT DOCUMENTS

| | | | |
|---|---|---|---|
| 4,113,514 | 9/1978 | Pankov et al. | 148/1.5 |
| 4,151,058 | 4/1979 | Kaplan et al. | 204/192 S |
| 4,187,126 | 2/1980 | Radd et al. | 148/1.5 |

OTHER PUBLICATIONS

Peercy et al. in "Laser–Solid Interactions & Laser Processing", 1978 ed. Ferris et al., AIP, N.Y. 1979, p. 331.
Greenwald et al., J. Appl. Phys. 50(2), (1979), 783.
Bertolotti et al., J. Appl. Phys. 50(1), (1979), 259.
Vitali et al., Phys. Letts. 63A(3), (1977), 351.
Chittick et al., J. Electrochem. Soc. 116 (1969) 77.
Spear et al., Solid St. Comm. 17 (1975) 1193.
Pankove, J. I., Appl. Phys. Letts. 32 (1978) 812, 439.
Brodsky et al., IBM-Tech. Discl. Bull. 20, (1978), 4962.
Moustakas, T. D., J. Electronic Materials, 8(3), (1979), 391.
Brodsky, M. H., IBM-TDB, 18, (1975), 582.
Bolotov et al., Sov. Phys. Semicond. 10, (1976), 338.
Seager et al., Appl. Phys. Letts., 34, (1979), 337.
De Kock et al., Appl. Phys. Letts., 27, (1975), 313.
Paesler et al., Phys. Rev. Letts., 41, (1978), 1492.
Connell et al., Phys. Rev. B, 13, (1976), 787.
Malhotra et al., Appl. Phys. Letts., 28, (1976), 47.
Elliott, S. R., Nature, 277, (1979), 85.

Primary Examiner—R. Dean
Assistant Examiner—Upendra Roy
Attorney, Agent, or Firm—Peter V. D. Wilde

[57] ABSTRACT

The application describes a technique for passivating point defects that are characteristic of laser annealed semiconductors. According to the technique, the laser annealed material is treated with atomic hydrogen to electrically deactivate the defects.

3 Claims, 1 Drawing Figure

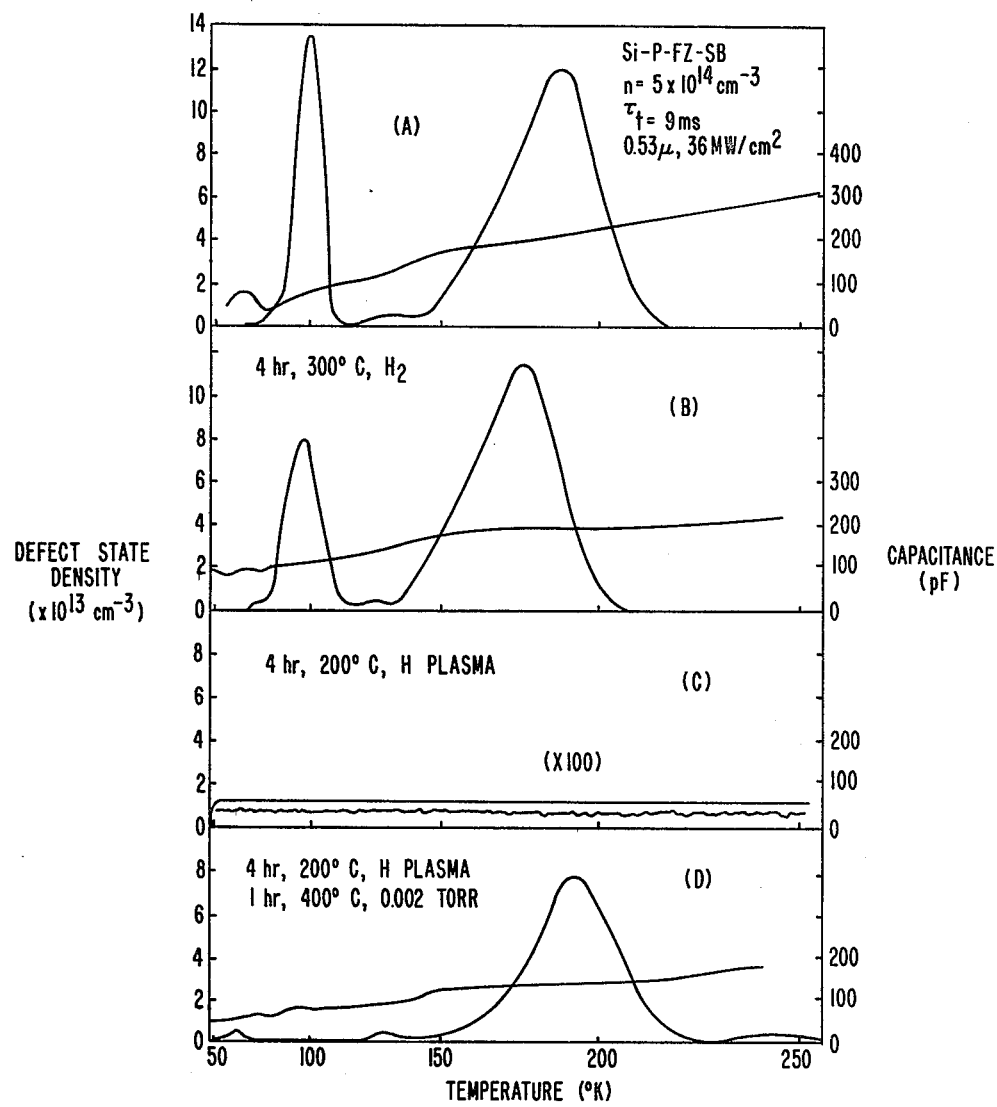

PASSIVATION OF DEFECTS IN LASER ANNEALED SEMICONDUCTORS

BACKGROUND OF THE INVENTION

Considerable effort has been devoted recently to a new tool in semiconductor technology, laser annealing. Laser annealing involves heating localized areas of a semiconductor, most notably silicon, to or near the melting point of the semiconductor, and rapidly cooling the material. As typically practiced, the material annealed is amorphous and constitutes a region within or overlying single crystal or substantially oriented material, and the heated portion of the semiconductor regrows or re-orients epitaxially. The technique has been applied to fabricating a wide variety of semiconductor devices, and has been proposed in various forms for processing bulk semiconductor material as well. It can also be utilized advantageously with single crystal or polycrystalline semiconductor and/or for various alloying processes without epitaxial regrowth. See, for example, U.S. Patent application G. K. Celler-T. E. Seidel, Ser. No. 917,841, filed June 22, 1978. Laser annealing is a rapid, effective tool for semiconductor manufacture, and promises to find widespread commercial application in sophisticated future integrated circuit and related semiconductor technologies.

While epitaxial regrowth of laser annealed semiconductors produces crystal material of exceedingly high quality, the material does suffer a major shortcoming. Laser annealed material contains ubiquitous defects that are quenched into the crystal during rapid cooling. In silicon, there appear to be two dominant kinds of defects present, a one which introduces defect states at 0.19 eV below the conduction band, a second at $E_c-0.38$. Both defects will anneal at about 700 degrees C., indicating that they are characteristic of quenched material. We postulate that they arise because the semiconductor is rapidly quenched from a high temperature condition. Whatever the mechanism, defects of this kind have been observed in both solid phase and molten phase laser annealed silicon. Similar defects have also been observed in other semiconductors.

These electrically active point defects impair the usefulness of laser annealed material for certain applications, notably for electroluminescent and photoelectric devices, because the defects are strong recombination centers for injected or photon generated carriers. They also impair the emitter injection efficiency of bipolar devices.

Defect mechanisms in semiconductors is a subject of widespread interest in semiconductor technology, and a variety of processes for treating specific defects have evolved. Hydrogen incorporation has long been known to have a marked effect on amorphous semiconductors, R. C. Chittick et al *J. Electrochem. Soc.* 116, 77 (1969). W. E. Spear et al *Sol. St. Conm.* 17, 1193 (1975). The proposed mechanism being reaction of dangling Si bonds with the H atom. Pankove correlated the photoluminescence efficiency of a-Si:H with the presence of atomic hydrogen. J. I. Pankove, *Appl. Phys. Lett.*, 32, 812 (1978). More recently, it has been reported that hydrogen treatment of single crystal silicon improves the reverse bias leakage currents of p-n junctions. J. I. Pankove et al *Appl. Phys Lett.* 32, 439 (1978). Seager and Ginley (*Appl. Phys. Lett.* 34, 337 (1979)) have indicated that hydrogen plasma exposure reduces grain boundary recombination rates in polycrystalline silicon. In addition, hydrogen has been correlated with the electrical inactivity of swirl defects in silicon. de Kock et al, *Appl. Phys. Letters*, 27, p. 313 (1975).

In spite of this background, and of intense interest in these characteristic point defects in laser annealed material, no mechanism has been reported to date for avoiding the consequences of these defects, other than by high temperature annealing. It is evident that a relatively slow, high temperature annealing step detracts from the attractiveness of the laser annealing technique.

BRIEF DESCRIPTION OF THE INVENTION

We have found a method for passivating residual point defects in the laser annealing semiconductor processes. We have demonstrated the method for laser annealed silicon. It involves treating the laser annealed material with a low temperature hydrogen plasma. Laser annealed silicon, treated by this technique, is largely free of electrically active defects, and is suitable for virtually any device application.

DETAILED DESCRIPTION OF THE INVENTION

The FIGURE is a plot of defect density versus temperature for four laser annealed silicon samples, demonstrating the efficacy of the process of the invention, and suggesting aspects of the mechanism by which it operates.

The silicon samples used in this work were 5 Ωcm phosphorus-doped, float-zone material. Point defects were produced by illuminating the wafers with a frequency doubled Nd:YAG laser ($\Gamma=0.53$ $\mu$m) in the scanning spot mode. A more complete description of this and related laser annealing exposure methods can be found in G. K. Celler-L. C. Kimerling-H. J. Leamy-J. M. Poate-G. A. Rozgonyi, Ser. No. 27,274, filed Apr. 5, 1979. The laser was Q-switched at 5 kHz, using a 140 n sec pulse width and a 34 $\mu$m spot diameter, at 34 MW/cm$^2$. Operation at this power melts the surface to a depth of 1.2 $\mu$m. Fabrication of the Schottky barrier necessary for the defect state measurements was done by room temperature evaporation of AuPd directly onto the laser treated surface.

The defect state concentrations were monitored by deep level transient spectroscopy (DLTS). In this technique, a region depleted of mobile carriers is created under the Schottky barrier by application of a reverse bias. As the sample temperature is ramped from shallow dopant freeze-out (~50 degrees K.) to room temperature the deeper defect states in the depleted region are repetitively filled by continuous pulsing. Electronic excitations which occur during the period between pulses give rise to capacitance transients which are analyzed with a lock-in amplifier. A peak in the DLTS spectrum is produced when the decay rate of the capacitance transient coincides with the effective time constant of the lock-in instrument. The experiment is calibrated to yield defect state concentrations from the spectral peak heights. In addition, a complimentary measurement, thermally stimulated capacitance scan (TSCAP) was taken on each sample. In this case, the defect states are full at 50 degrees K. The sample is heated under a constant reverse bias, and at a temperature which represents sufficient thermal energy to stimulate a bound-to-band transition an increase in capacitance is recorded.

A capacitance transient spectrum of the defect states created by laser melting of silicon is shown by trace A in the FIGURE. The two major peaks represent defect states in concentrations of ~$10^{14}$ cm$^{-3}$. The steps in the thermally stimulated capacitance trace are a result of the emptying of these traps.

Reaction of the defects with atomic hydrogen was achieved by inserting the samples in a 0.38 Torr hydrogen plasma. The plasma was confined in a quartz tube and was created by external RF electrodes. The plasma reactor was externally heated by resistance furnaces. Samples were annealed for 4 hours in the hydrogen plasma which was sustained until after cool down to 100 degrees C. The molecular hydrogen anneals were performed in the same apparatus without the RF generator. The plasma parameters can be varied substantially to achieve equivalent results. The following ranges are recommended: substrate temperature 100 degrees to 300 degrees C., $H_2$ pressure: 0.1 to 0.5 Torr, RF frequency: 10-100 MHz, Power: 20 to 100 watts.

We estimate that in a plasma of this type the atomic hydrogen concentration is of the order of 0.01% to 2% of the total hydrogen present. Exposure times of from a few seconds to several minutes should be adequate to passivate a substantial number of the defects present.

The effect of various treatments upon the electrical activity of the point defects is shown in Traces B-D. Spectrum (B) indicates that a 4 hour anneal in molecular hydrogen has no effect on the quenched-in defect centers. The slight changes are typical of observed spatial variations and not caused by the hydrogen anneal.

The dramatic results of the hydrogen plasma anneal are evident in the third spectrum. After 4 hours at 200 degrees C. in hydrogen plasma, the DLTS spectrum is featureless despite a hundred-fold increase in amplification. No electrically active defects are observed. The atomic hydrogen was effectively neutralized the defective bonds related to the quenched-in centers. The reduction in sample capacitance to the value of the initial substrate and the absence of steps in the TSCAP scan are further indications of the elimination of these defect states.

This experiment was duplicated with a treatment time of 10 minutes with essentially equivalent defect passivation. As a practical matter the passivation process is instantaneous, which is one of the attractive features of the invention.

An often observed consequence of laser processing is the introduction of a thin surface layer of donor states (excess electron concentration). In lightly doped, p-type substrates, $p < 10^{16}$ cm$^{-3}$, this layer can act as a conducting short between adjacent devices. The atomic hydrogen treatment effectively removes these excess donors along with the above-discussed defect states.

Additional evidence of hydrogen passivation of defects was obtained by monitoring sample weight and sheet resistance before and after hydrogen plasma treatment. No significant changes in either property was observed, indicating that the plasma was not simply etching the silicon surface. In addition trace D of the FIGURE shows the spectrum for the hydrogen plasma annealed sample given a vacuum anneal at 400 degrees C. for 1 hour at a pressure of 0.002 Torr to evolve the hydrogen. The reappearance of the electrically active defects is evident. Defect state densities of $8 \times 10^{13}$ cm$^{-3}$ are again apparent and the change in occupation of these traps again produce increases in the capacitance.

Having reached the important understanding that atomic hydrogen is effective at low temperatures for passivating the kind of defects of concern here, it is evident that a hydrogen plasma is not essential, although it remains a convenient and preferred source of the requisite chemical species. Accordingly, other sources of atomic hydrogen can be used as well, e.g., a hot filament, electrochemical cell, a semi-permeable membrane, a high voltage discharge, (dc plasma) or other alternatives known to skilled chemists. To characterize the essential reaction conditions necessary to achieve the objective of the invention, we impose the limitation that the laser annealed semiconductor be exposed to atomic hydrogen to an integrated flux greater than $10^{11}$ cm$^{-2}$.

Typically, partial pressures of atomic hydrogen will range from 0.01-1 Torr; temperatures from 100 degrees C.-300 degrees C.; and times from $10^{-2}$ sec at the higher temperatures to >100 sec at lower temperatures. In all cases, it is important that exposure to atomic hydrogen be maintained until the substrate temperature falls below 100 degrees C., to prevent out-diffusion of the hydrogen. It should be understood that these conditions are threshold conditions for defect removal, and longer treatments may be found advantageous for other reasons.

We believe that the techniques described here are applicable to semiconductor materials in general, and particularly to silicon, and III-V and II-VI compounds.

This specification refers in several instances to "laser" annealing. It is well known in the art that electron beam radiation is equivalent in many respects to laser radiation in the context of the annealing processes described here. In this connection reference is made to U.S. Pat. No. 4,082,958, issued Apr. 4, 1978.

The foregoing describes also an annealing embodiment in which portions of the semiconductor are actually melted. The technique is applicable also to the well known solid phase laser annealing process in which the semiconductor is heated to within approximately 200 degrees C. of the melting point, and then quenched. By quenching we intend to describe a process in which the heated region cools at a rate in excess of $10^3$ degrees/sec. In typical laser annealing process the cooling rate is in the range of $10^8$-$10^{14}$ degrees C./sec.

Various additional modifications and extensions of this invention will become apparent to those skilled in the art. All such variations and deviations which basically rely on the teachings through which this invention has advanced the art are properly considered to be within the spirit and scope of this invention.

We claim:

1. A method for processing a semiconductor comprising exposing at least a portion of the semiconductor to laser or electron radiation sufficient to heat the portion to within 200 degrees C. of the melting point, quenching the heated portion, and exposing the quenched portion to atomic hydrogen thereby passivating a substantial number of the defects.

2. The method of claim 1 wherein the atomic hydrogen has an integrated flux of at least $10^{11}$ atoms per square centimeter.

3. The method of claim 2 wherein the atomic hydrogen is produced by a hydrogen plasma.

* * * * *